US006707674B1

(12) United States Patent
Bryant et al.

(10) Patent No.: US 6,707,674 B1
(45) Date of Patent: Mar. 16, 2004

(54) DUAL SPRING HEAT SINK RETENTION

(75) Inventors: David Bryant, Austin, TX (US); Daniel S. Carr, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/289,800

(22) Filed: Nov. 7, 2002

(51) Int. Cl.⁷ ................................................ H05K 7/20
(52) U.S. Cl. ...................... 361/704; 257/727; 257/719; 361/710; 361/719; 361/801
(58) Field of Search ................ 165/80.2–80.3, 165/185; 257/718–719, 726–727; 361/704, 707, 709–710, 719–726, 697, 801, 760

(56) References Cited

U.S. PATENT DOCUMENTS

| | | | |
|---|---|---|---|
| 5,331,507 A | | 7/1994 | Kyung et al. |
| 5,448,449 A | | 9/1995 | Bright et al. |
| 5,495,392 A | * | 2/1996 | Shen ........................... 361/697 |
| 5,600,540 A | | 2/1997 | Blomquist |
| 6,147,866 A | * | 11/2000 | Saito et al. ................. 361/704 |
| 6,563,213 B1 | * | 5/2003 | Wong et al. ................ 257/727 |

* cited by examiner

Primary Examiner—Gregory D Thompson
(74) Attorney, Agent, or Firm—Haynes and Boone, LLP (57) ABSTRACT

A heat sink retention apparatus includes a frame for supporting a heat sink. A plurality of flexible members extend from opposite ends of the frame. Each flexible member includes a retention tab and one of the retention tabs includes a retraction tab. A heat sink is snapped-into the frame by engaging either of the retention tabs and flexing the other retention tab. The retraction tab can be flexed to disengage one of the retention tabs for extracting the heat sink from the frame.

20 Claims, 8 Drawing Sheets

DUAL SPRING HEAT SINK RETENTION

BACKGROUND

The present disclosure relates generally to information handling systems, and more particularly to heat sink retention in such systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs is and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

New processors are requiring larger and heavier heatsink/fansink solutions, which have created additional complexity during manufacture. In order to preserve contact between the processor die and the heat sink, the fastener solutions create a large amount of preload force and, as a consequence, the fastener has become complicated to assemble. The difficulty in assembly of current solutions also causes ergonomic issues to assemblers and is very difficult to disassemble. As the complexity of the heat sink and retention mechanisms increases, the number/cost of parts and time to assemble has also increased.

One solution uses metal leaf springs placed on each side of the heat sink, attached to plastics bases. This method creates an accessibility issue inside the chassis creating four areas that need to be accessed in order to assemble and disassemble the heat sink. This drives cost into the system.

Another solution provides metal clips that span across the middle of the heat sink and attach to the middle socket. This creates a single contact area on the sink allowing excessive wobble of the sink. The attachment method to current sockets is unsatisfactory.

A further solution uses single lever mechanism to actuate a torsion system that rotates into place retaining the heat sink against shock events during shipping. The actuation of the torsion system is created by a Geneva gear mechanism that locks the system from rotation at its lower and upper position.

Therefore, what is needed is a heat sink retention device that provides a balanced load on the heat sink, reduces the number of parts required, is cost efficient and decreases assembly time.

SUMMARY

One embodiment, accordingly, provides a heat sink retention apparatus including a frame for supporting a heat sink. A plurality of flexible members extend from opposite ends of the frame. Each flexible member includes a retention tab. At least one of the retention tabs includes a retraction tab.

A principal advantage of this embodiment is that the springs can be balanced to provide equal pressure. The number of parts required is reduced. The cost is low and the device requires decreased assembly time.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory is (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
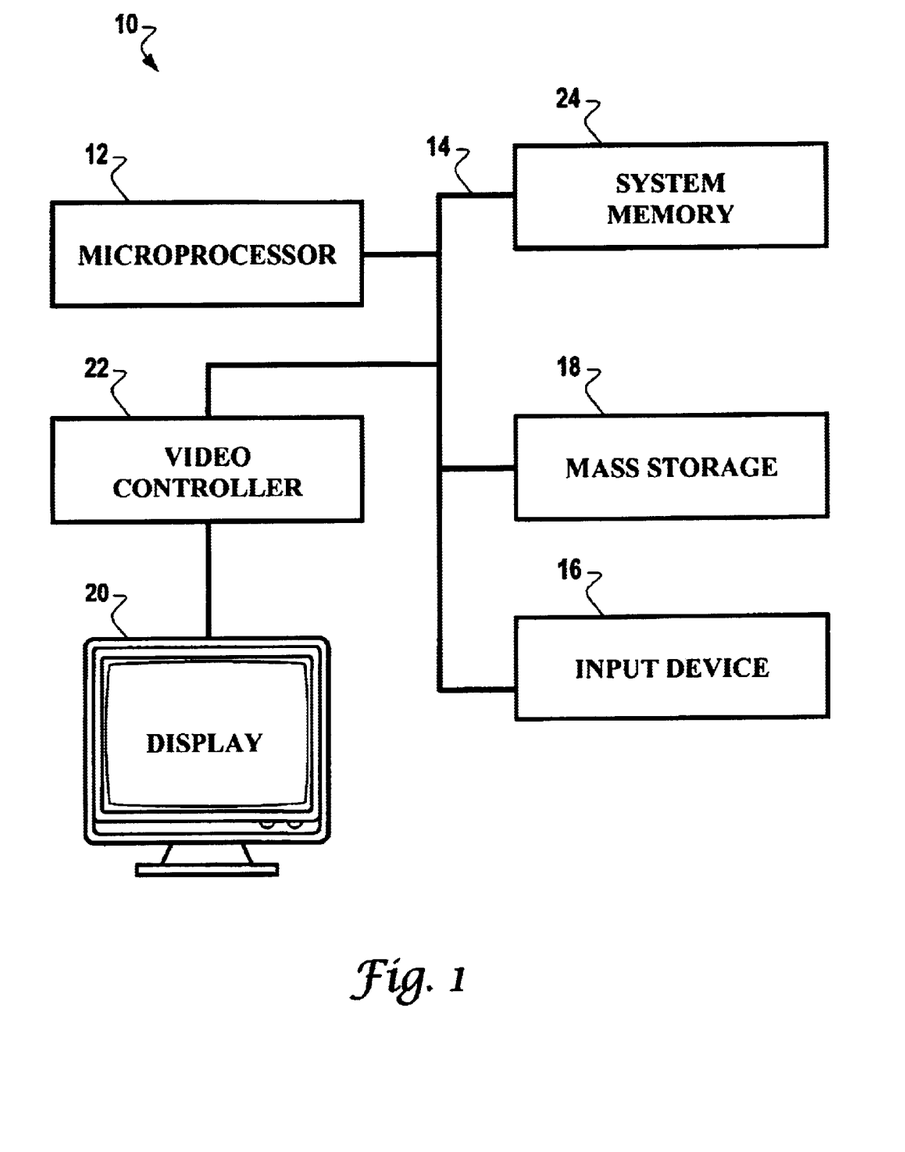
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12.

Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is s coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
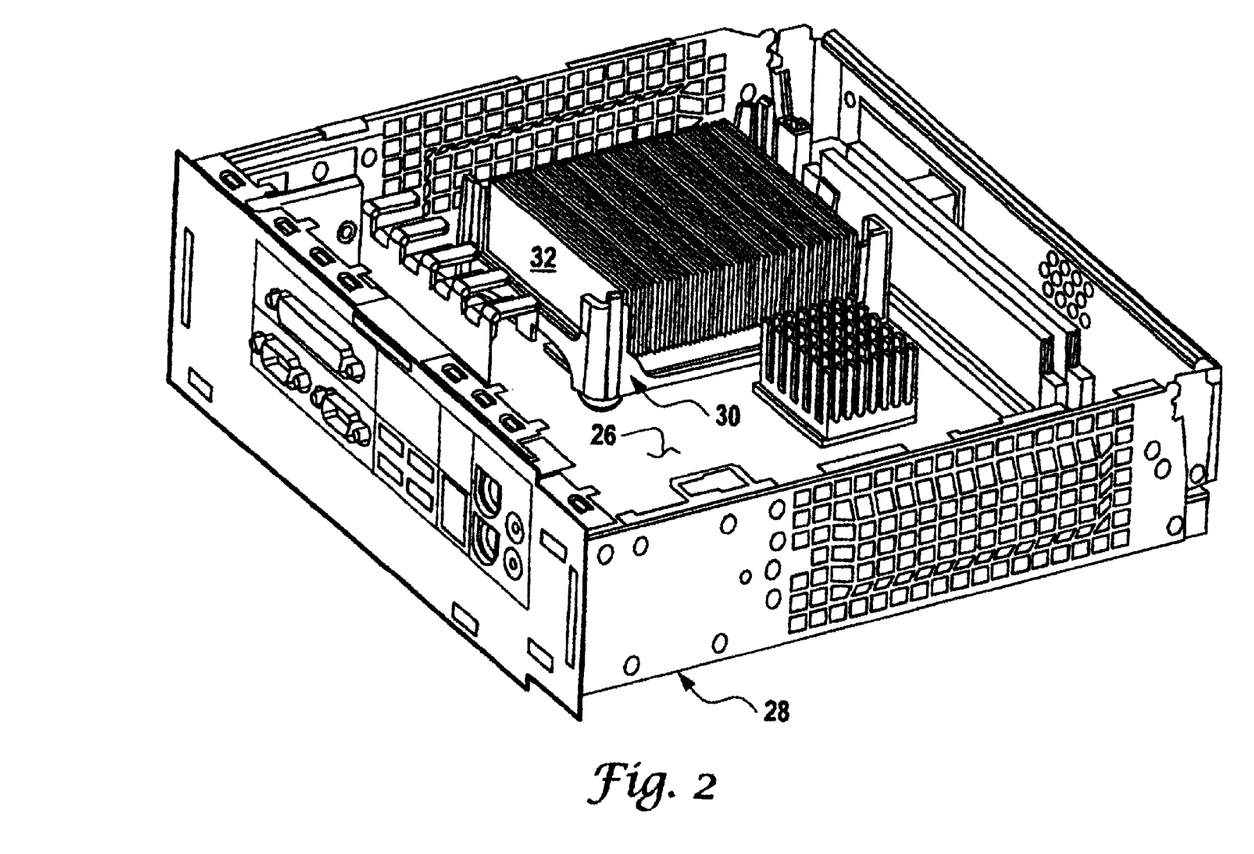
FIG. 2 is a perspective view illustrating an embodiment of a chassis including a heat sink.

Microprocessor 12 is mounted on a motherboard 26 in a chassis 28, FIG. 2, which may be a chassis of various form factors. A frame member 30 is mounted on motherboard 26 in chassis 28 such that the frame member 30 is positioned adjacent the microprocessor 12 so as to support a heat sink 32, seated in contact with the microprocessor 12, discussed below.

Figure 3:
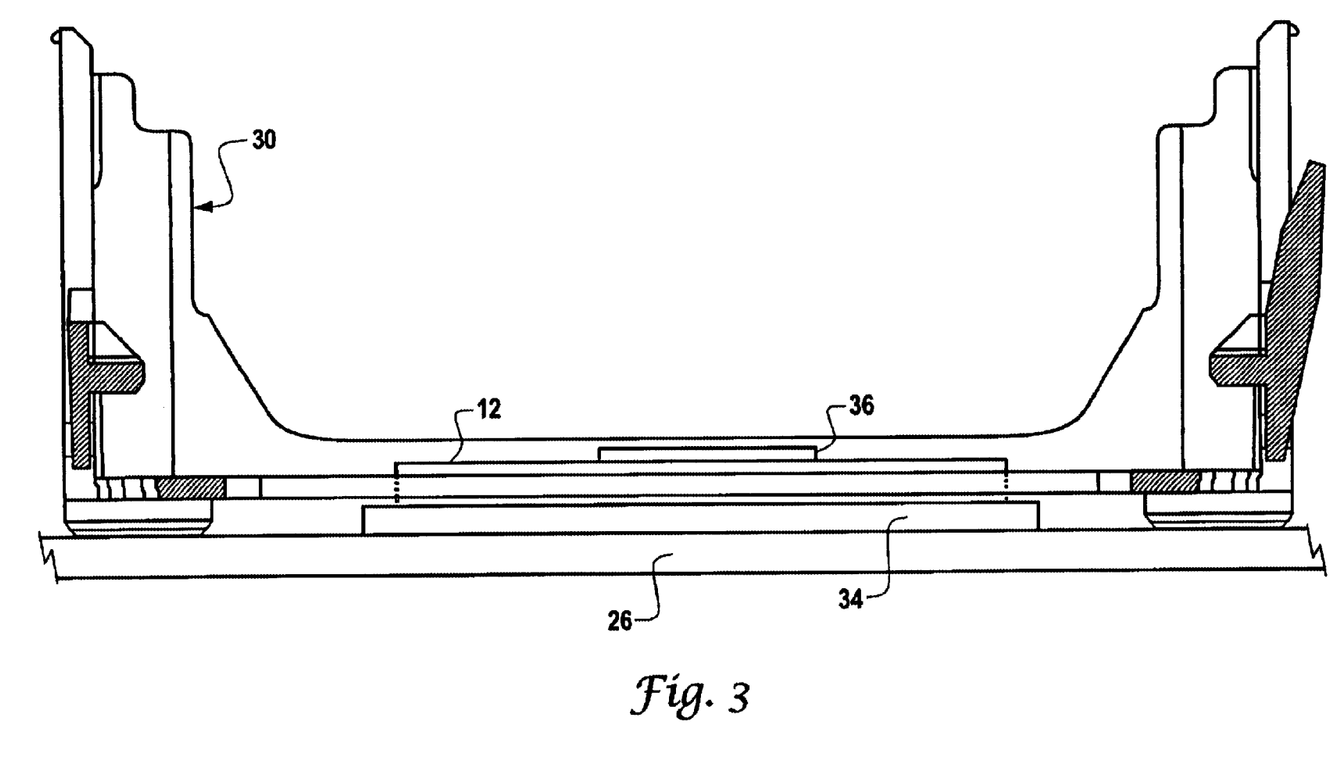
FIG. 3 is a side view illustrating an embodiment of a frame member.
Figure 4:
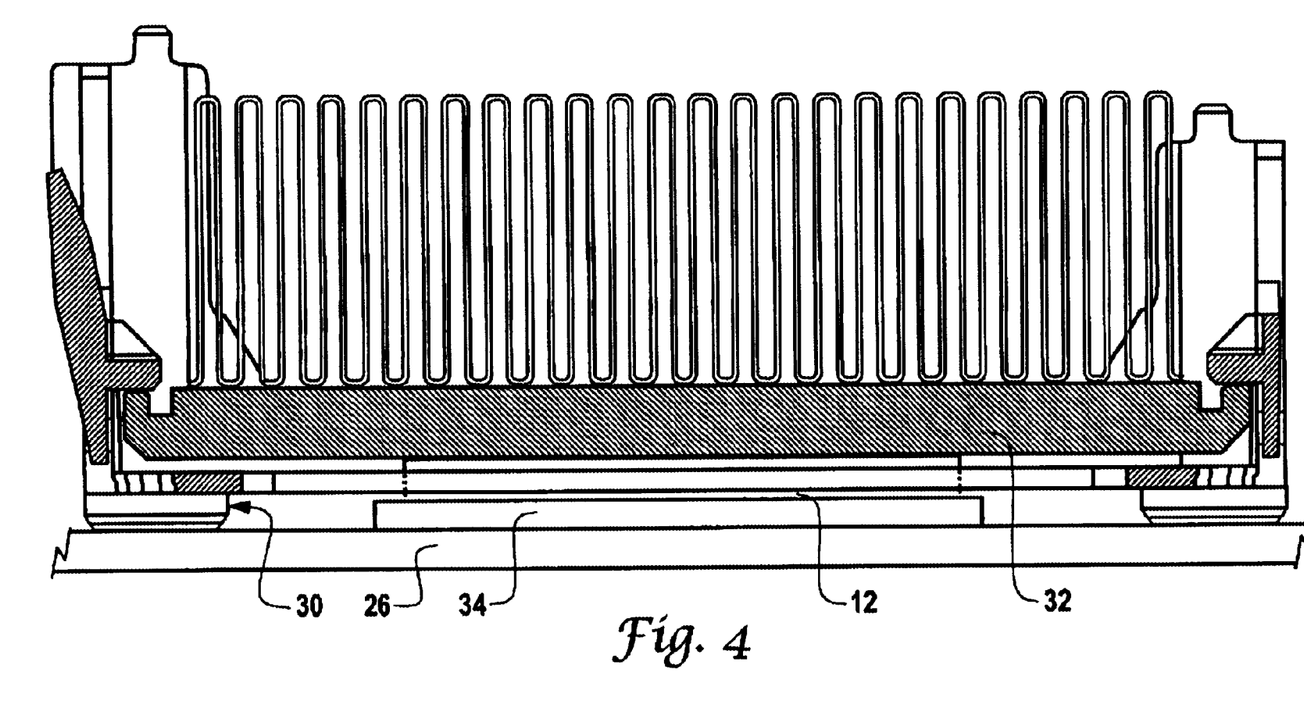
FIG. 4 is a side view illustrating an embodiment of the frame member supporting and retaining the heat sink.

Chassis 28, FIG. 2, supports several of the components of computer system 10. In addition, motherboard 26 is mounted in chassis 28 and a support base 34, FIG. 3, is mounted on and electrically connected to the motherboard 26. Microprocessor 12 is mounted on the support base 34. A heat spreader 36 is a portion of the microprocessor 12 through which heat generated by the microprocessor 12 is concentrated for contact with heat sink 32, FIG. 4.

Figure 5:
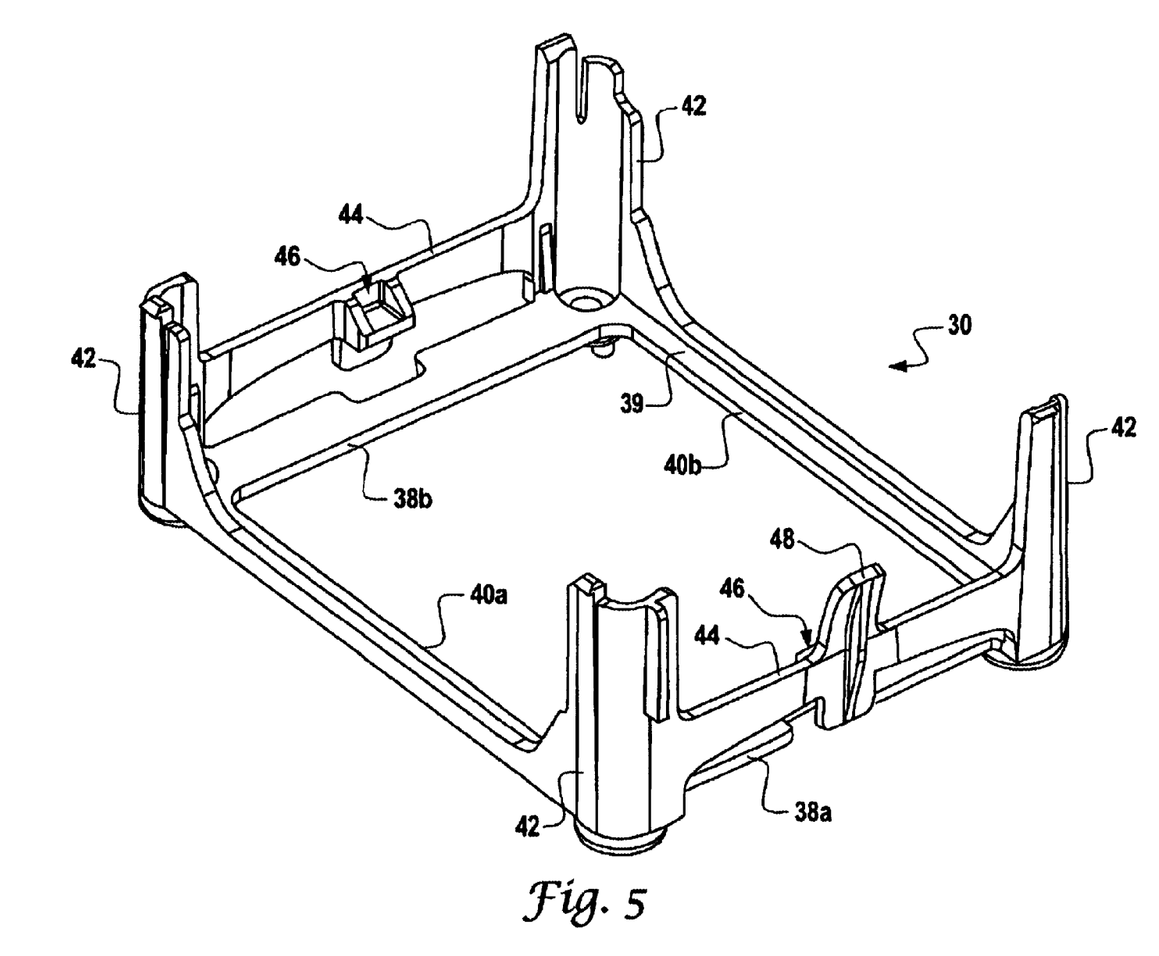
FIG. 5 is a perspective view illustrating an embodiment of the frame member.

Frame member 30, FIG. 5, is generally rectangular and includes a pair of opposed end members 38a, 38b interconnected with a pair of opposed side members 40a, 40b at a plurality of corner columns 42 to form a surface 39 for supporting heat sink 32. A pair of flexible member beams 44 each extend between two of the columns 42. One of the flexible members 44 is adjacent the end member 38a and the other flexible member 44 is adjacent the end member 38b. It should be understood that each flexible member 44 could alternatively be an extension of a respective end member 38a and 38b.

Each flexible member 44 includes a retention tab 46 and at least one of the retention tabs 46 includes a retraction tab 48. Each retention tab 46 includes a pair of opposed ramp surfaces 50 and 52, FIGS. 6 and 7. The ramp surface 50 is opposed to ramp surface 52 in that ramp surface 50 is on a first side 46a of retention tab 46 and ramp surface 52 is on a second side 46b of retention tab 46. The retraction tab 48 extends from one of the retention tabs 46.

Figure 6:
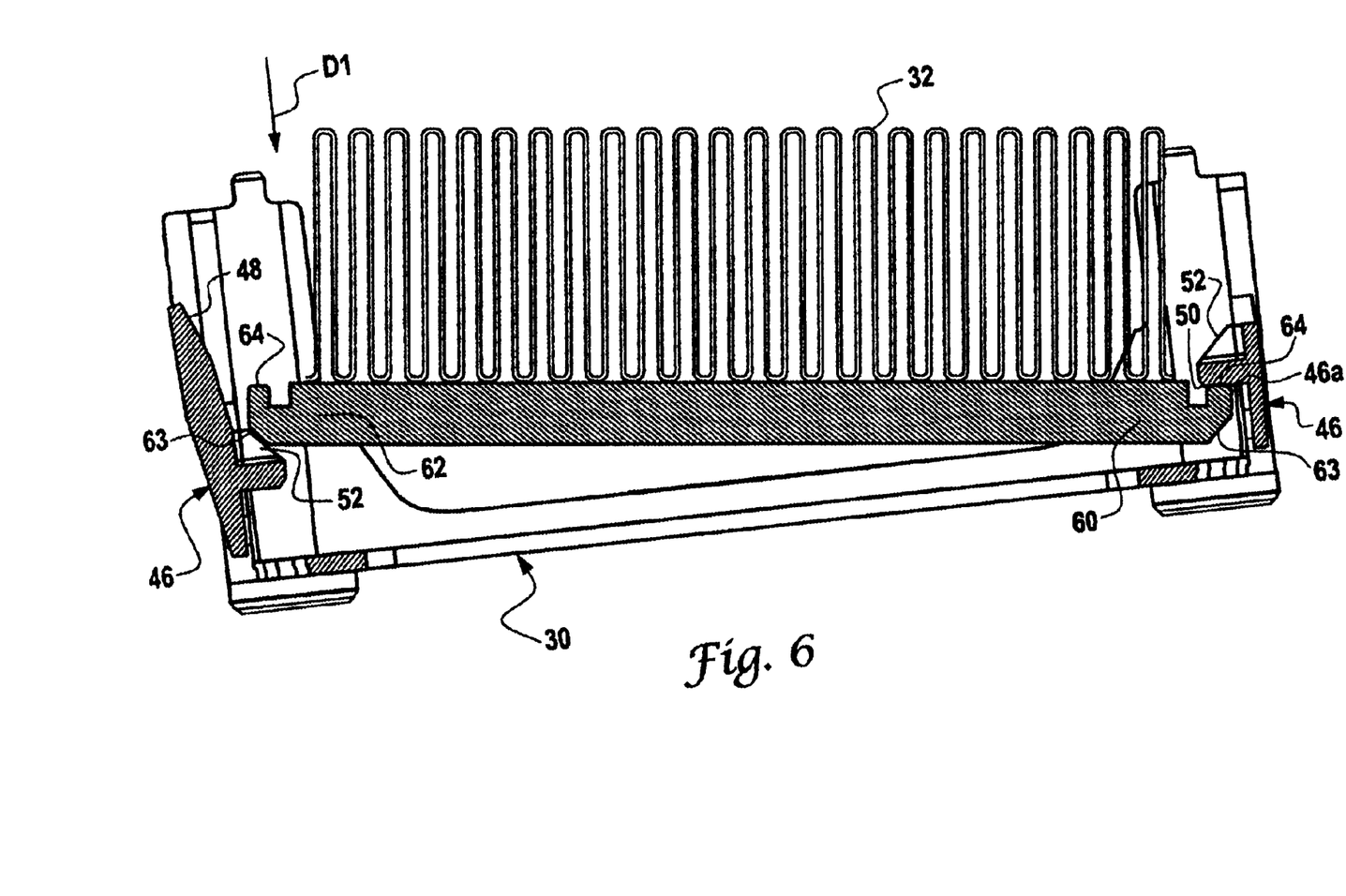
FIGS. 6–8 are side views Illustrating an embodiment of the heat sink being seated and/or removed from the frame member.
Figure 7:
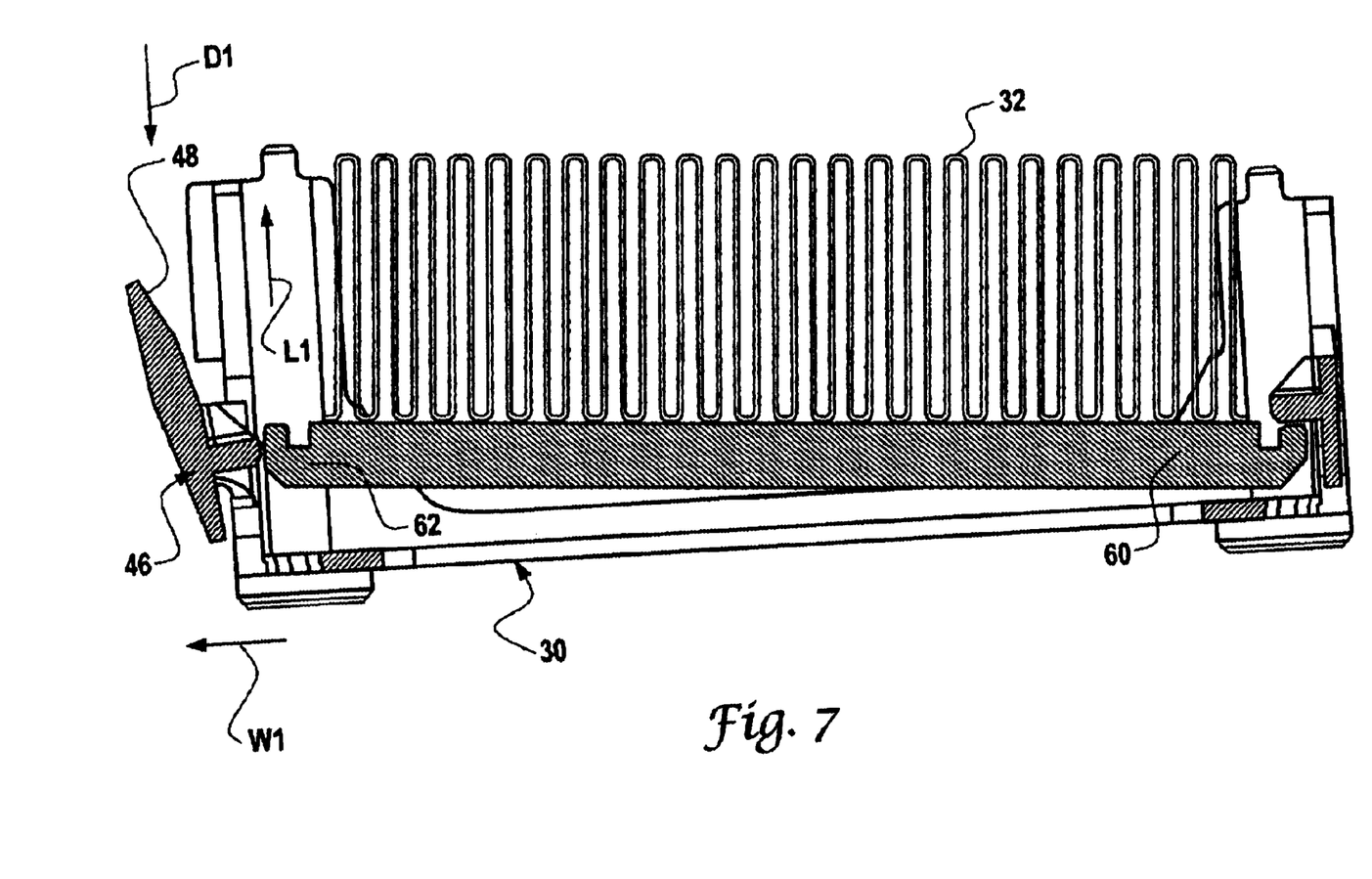
Figure 8:
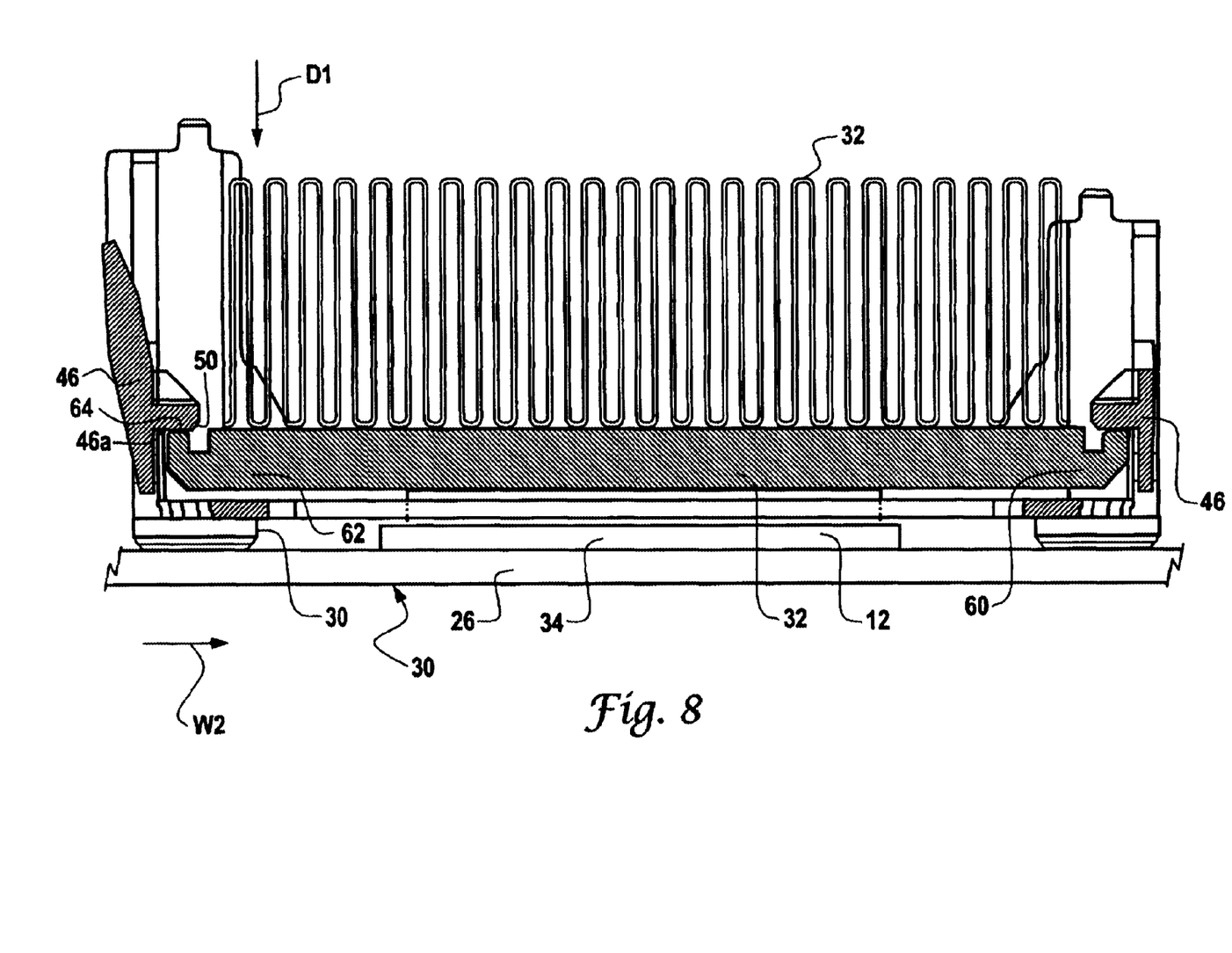

In operation, each opposite end 60 and 62 of heat sink 32, FIGS. 6, 7 and 8, includes a chamfer 63 and a substantially flat surface 64. One end 60, FIG. 6, of heat sink 32 is inserted at an angle to toe in to frame member 30 so that one flat surface 64 engages side 46a of one of the retention tabs 46. In this position, the other end 62 of heat sink 32, positions its respective chamfer 63 in engagement with ramp 52 of an opposite retention tab 46. A downward force in a direction D1, FIG. 7, urges end 62 to flex the opposite retention tab 46 outwardly in a direction W1. Still further downward force in direction D1, FIG. 8, urges end 62 to engage ramp 50 which further urges end 62 downward to clear the opposite retention tab 46. Finally, flat surface 64 is engaged when side 46a of retention tab 46 moves inwardly in a direction W2, so that each end 60 and 62 of heat sink 32 is retained by a downward, or D1, force due to engagement with retention tabs 46.

For removal, manual flexure of retraction tab 48, FIG. 7, in the outwardly direction W1, will displace retention tab 46 sufficiently to permit end 62 of heat sink 32 to be lifted in a direction L1 to permit heat sink 32 to be removed from frame member 30.

In summary, the present device comprises a single molded plastic part that provides a balanced load on the heat sink. The heat sink is placed into the frame at an angle to "toe in" using ramping forces (chamfers) to lift the plastic spring. The opposite end of the heat sink is forced into the plastic frame deflecting the second plastic spring out and then up using ramping forces. Each spring end has two motions; 1) outward to provide clearance for the heat sink, and inward to lift the spring to capture the heat sink and position the spring to provide downward force; and 2) downward to provide the clamping force required to hold the heat sink in place.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat sink retention apparatus comprising:
   a frame for supporting a heat sink;
   a plurality of flexible members extending from opposite ends of the frame,
   each flexible member including a retention tab; and
   at least one of the retention tabs including a retraction tab.

2. The apparatus as defined in claim 1 wherein each end of the frame includes a pair of corner members.

3. The apparatus as defined in claim 2 wherein each flexible member extends between two of the corner members.

4. The apparatus as defined in claim 3 wherein the flexible members each include a flexible beam.

5. The apparatus as defined in claim 4 wherein each retention tab is mounted on a respective beam.

6. The apparatus as defined in claim 1 wherein each retention tab includes a pair of ramps.

7. The apparatus as defined in claim 1 wherein each retention tab includes a pair of opposed ramps.

8. The apparatus as defined in claim 1 wherein the retraction tab extends from a respective retention tab.

9. An information handling system comprising:
   a chassis;
   a microprocessor mounted in the chassis;
   a storage coupled to the microprocessor;
   a heat sink retention frame mounted in the chassis;
   a plurality of flexible members extending from opposite ends of the frame;
   each flexible member including a retention tab; and
   at least one of the retention tabs including a retraction tab.

10. The system as defined in claim 9 wherein each end of the frame includes a pair of corner members.

11. The system as defined in claim 10 wherein each flexible member extends between two of the corner members.

12. The system as defined in claim 11 wherein the flexible members each include a flexible beam.

13. The system as defined in claim 12 wherein each retention tab is mounted on a respective beam.

14. The system as defined in claim 9 wherein each retention tab includes a pair of ramps.

15. The system as defined in claim 9 wherein each retention tab includes a pair of opposed ramps.

16. The system as defined in claim 9 wherein the retraction tab extends from a respective retention tab.

17. A method of retaining a heat sink in a chassis comprising:
   providing a frame;
   extending a plurality of opposed flexible members from the frame;

providing a retention tab on each flexible member, providing a retraction tab on one of the retention tabs;

mounting the frame in the chassis;

inserting one end of a heat sink under one of the retention tabs; and urging another end of the heat sink into engagement with the opposed one of the retention tabs for snap-in seating of the heat sink under the opposed retention tabs.

18. The method as defined claim 17 further comprising:

providing a plurality of columns extending from the frame.

19. The method as defined in claim 18 wherein:

one of the flexible members comprises a first beam extending between a first two of the columns and;

another one of the flexible members comprises a second beam extending between a second two of the columns.

20. The method as defined in claim 17 further comprising:

engaging the retraction tab for flexing one of the flexible members; and extracting the heat sink from the frame.

\* \* \* \* \*